United States Patent [19]
Uemura et al.

[11] Patent Number: 5,722,160
[45] Date of Patent: Mar. 3, 1998

[54] PACKAGING METHOD OF BGA TYPE ELECTRONIC COMPONENT

[75] Inventors: Yasuhiro Uemura, Hadano; Masakazu Sakaue, Atsugi, both of Japan

[73] Assignee: Hitachi, Ltd., Tokyo, Japan

[21] Appl. No.: 547,811

[22] Filed: Oct. 25, 1995

[30] Foreign Application Priority Data

Oct. 28, 1994 [JP] Japan ................................. 6-265094

[51] Int. Cl.⁶ ................................................. H05K 3/34
[52] U.S. Cl. .................... 29/840; 228/56.3; 228/180.1; 228/180.21; 228/180.22
[58] Field of Search ................. 228/180.1, 180.21, 228/180.22; 29/840

[56] References Cited

U.S. PATENT DOCUMENTS

| | | | |
|---|---|---|---|
| 4,830,264 | 5/1989 | Bitaillou et al. | 228/180.21 |
| 5,275,330 | 1/1994 | Issacs et al. | 228/180.21 |
| 5,409,157 | 4/1995 | Nagesh et al. | 228/180.22 |
| 5,447,264 | 9/1995 | Koopman et al. | 228/56.3 |

FOREIGN PATENT DOCUMENTS 1-61029  3/1989  Japan ................................. 228/180.1

OTHER PUBLICATIONS

"Electronics Materials", vol. 33, No. 9, pp. 49–54, by K.K. Kogyo Chosa-kai, Sep. 1, 1994. (in Japanese).
Kyushu Matsushita Create Show Seminar Technical Report, Jun. 1993.
"Recent Publications by IBM Authors", IBM Journal of Research Development, vol. 37, No. 5, 1993.
H.V. Mahaney, "Thermal Modeling of the Infrared Reflow Process for Solder Ball Connect (SBC)", IBM Journal of Research and Development, vol. 37, No. 5, Sep. 1993, pp. 609–619.
M.D. Ries et al, "Attachment of Solder Ball Connect (SBC) Packages to Circuit Cards", IBM Journal of Research and Development, vol. 37, No. 5, Sep. 1993, pp. 597–608.

H.C. Choi et al, "Solid Ball Connect (SBC) Assemblies Under Thermal Loading: Strain Analysis Via Image Processing, and Reliability Considerations", IBM Journal of Research and Development, vol. 37, No. 5, pp. 649–659.

J.S. Corbin, "Finite Element Analysis for Solder Ball Connect (SBC) Structural Design Optimization", IBM Journal of Research and Development, vol. 37, No. 5, Sep. 1993, pp. 585–596.

(List continued on next page.)

*Primary Examiner*—Carl J. Arbes
*Attorney, Agent, or Firm*—Fay, Sharpe, Beall, Fagan, Minnich & McKee

[57] ABSTRACT

A packaging method of an electronic component for packaging the electronic component to a packaging substrate comprises the steps of: forming a predetermined quantity of solder bumps at connection portions of the electronic component; forming through-holes and pads on the packaging substrate in such a manner as to correspond to the solder bumps; applying a solder paste to pad portions of the through-holes and the pads formed on the surface of the packaging substrate in such a manner as to attain a specific quantity of solder components with the predetermined quantity of the solder bump; and heating the electronic component and the packaging substrate to a predetermined temperature such that button-shaped connection bumps having a predetermined height are formed between the pads and the packaging substrate so as to connect the electronic component and the packaging substrate and to keep a predetermined gap between the electronic component and the packaging substrate, and cylindrical-post connection bumps are formed between the through-holes and the packaging substrate in accordance with this predetermined gap so as to connect the electronic component and the packaging substrate. In this way, the cylindrical-post connection bumps are formed in association with the button-shaped connection bumps.

18 Claims, 3 Drawing Sheets

OTHER PUBLICATIONS

Y. Guo et al, "Solder Ball Connect (SBC) Assemblies Under Thermal Loading: Deformation Measurement Via Moire Interferometry, and its Interpretation", IBM Journal of Research and Development, vol. 37, No. 5, Sep. 1993, pp. 635–647.

T.Y. Wu et al, "Thermal–Mechanical Strain Charcaterization for Printed Wiring Boards", IBM Journal of Research and Development, vol. 37, No. 5, Sep. 1993, pp. 621–634.

IBM Journal of Research and Development, vol. 37, No. 5, Sep. 1993, pp. 581–583 (Preface) and pp. 675–676 (Recent IBM Patents).

Research Disclosure, Apr., 1991 No. 324.

PACKAGING METHOD OF BGA TYPE ELECTRONIC COMPONENT

BACKGROUND OF THE INVENTION

The present invention relates to a packaging technology of surface package type electronic components. More particularly, the present invention relates to a packaging method of BGA (Ball Grid Array) type electronic components having a thermal expansion coefficient different from that of a printed wiring board and having high exothermy.

The technology of this kind is described, for example, in "Electronic Materials", Vol. 33, No. 9, pp. 49 to 54, published by K.K. Kogyo Chosa-kai, Sep. 1, 1994. The packaging system of the BGA type electronic components disclosed in this reference packages as such the BGA electronic component having a structure wherein ball bumps are formed on a substrate made of ceramic or organic materials, to a printed wiring board.

SUMMARY OF THE INVENTION

It is an object of the present invention to provide a packaging method of a BGA type electronic component which can control a bump shape from a button shape to a cylindrical post shape.

It is another object of the present invention to provide a packaging technology of an electronic component capable of improving reliability of a connection portion of a bump.

It is still another object of the present invention to provide a packaging technology of an electronic component capable of easily removing an electronic component.

When an electronic component packaged to a packaging substrate is operated, heat is generated in response to types of the electronic components, so that a stress concentrates at a solder connected portion between the electronic components and the packaging substrate due to the thermal expansion of the portion caused by heat. It is known that this stress concentration can be eliminated by shaping a solder connection portion into a cylindrical post shape, and the present invention forms cylindrical-post solder connection portions in association with spherical or button-shaped solder connection portions that have been known in the past.

To accomplish the object described above, the first aspect according to an embodiment of the present invention resides in that a packaging method of an electronic component for packaging the electronic component to a packaging substrate comprises the steps of a) forming solder bumps having a predetermined quantity at connection portions of the electronic component; b) forming through-holes and pads on the packaging substrate in such a manner as to correspond to the solder bumps; c) applying a solder paste to pad portions of the through-holes and the pads formed on the surface of the packaging substrate so as to attain a specific quantity of solder components with the predetermined quantity of the solder bumps; and d) heating the electronic component and the packaging substrate to a predetermined temperature so that spherical or button-shaped connection bumps having a predetermined height are formed between the pads and the electronic component so as to connect the electronic component and the packaging substrate and to keep a predetermined gap between them, and cylindrical-post connection bumps are formed between the through-holes and the electronic component in accordance with this predetermined gap so as to connect the electronic component and the packaging substrate.

The specific quantity of the solder components at the step c) is determined by at least the solder bumps and the solder paste.

The specific quantity of the solder components is determined in accordance with the surface area of the pad portion of the through-hole, the thickness of the packaging substrate, that is, the depth of the through-hole, and the inner diameter of the through-hole.

The second aspect of the present invention resides in that a packaging method of an electronic component for packaging the electronic component to a packaging substrate comprises the steps of a) forming solder bumps having a predetermined quantity at connection portions of the electronic component; b) forming through-holes and pads on the packaging substrate in such a manner as to correspond to the solder bumps; c) applying a solder paste to pad portions of the through-hole and the pads formed on the surface of the packaging substrate so as to attain a specific quantity of solder components with the predetermined quantity of the solder bumps; d) inserting inclusion means having a predetermined thickness at a part between the electronic component and the packaging substrate so as to keep a predetermined gap between the electronic component and the packaging substrate; and e) heating the electronic component and the packaging substrate to a predetermined temperature so that spherical or button-shaped connection bumps having a predetermined height are formed between the pads and the electronic component so as to connect the electronic component and the electronic component, and cylindrical-post connection bumps are formed between the through-holes and the electronic component in accordance with the predetermined gap so as to connect the electronic component and the packaging substrate.

The specific quantity of the solder components at the step c) is determined by at least the solder bumps and the solder paste.

The third aspect of the present invention resides in that a packaging method of an electronic component for packaging the electronic component to a packaging substrate comprises the steps of a) forming through-holes and pads on a substrate for mounting the electronic component thereto; b) forming pads on the packaging substrate in such a manner as to correspond to the through-holes and the pads on the substrate of the electronic component; c) applying a predetermined quantity of a solder paste in such a manner as to attain a specific quantity of solder components in accordance with each pad; and d) heating the substrate of the electronic component and the packaging substrate to a predetermined temperature so that spherical or button-shaped connection bumps having a predetermined height are formed between the substrate for mounting the electronic component and the packaging substrate so as to connect the substrate for mounting the electronic component and the packaging substrate and to keep a predetermined gap between them, and cylindrical-post connection bumps are formed between the through-holes of the substrate for mounting the electronic component and the pads of the packaging substrate in accordance with this predetermined gap so as to connect the substrate for mounting the electronic component and the packaging substrate.

The specific quantity of the solder components is determined in accordance with the surface area of the pads, the surface area of the pad portion of the through-hole, the thickness of the substrate for mounting the electronic component, that is, the thickness of the through-hole, and the inner diameter of the through-hole.

The fourth aspect of the present invention resides in that a packaging method of an electronic component for packaging the electronic component to a packaging substrate comprises the steps of a) forming through-holes and pads on a substrate for mounting the electronic component thereto; b) forming pads on the packaging substrate in such a manner as to correspond to the through-holes and the pads formed on the substrate of the electronic component; c) applying a predetermined quantity of a solder paste so as to attain a specific quantity of solder components with each pad; d) inserting inclusion means having a predetermined thickness at a part between the substrate of the electronic component and the packaging substrate so as to keep a predetermined gap between the substrate of the electronic component and the packaging substrate; and e) heating the substrate for mounting the electronic component and the packaging substrate to a predetermined temperature so that spherical or button-shaped connection bumps having a predetermined height are formed between the substrate for mounting the electronic component and the packaging substrate so as to connect the substrate for mounting the electronic component and the packaging substrate, and cylindrical-post connection bumps are formed between the through-holes of the substrate for mounting the electronic component and the pads of the packaging substrate in accordance with the predetermined gap so as to connect the substrate for mounting the electronic component and the packaging substrate.

The specific quantity of the solder components is determined in accordance with the surface area of the pads, the surface area of the pad portions of the through-holes, the thickness of the substrate for mounting the electronic component, that is, the depth of the through-holes, and the inner diameter of the through-holes.

The fifth aspect of the present invention resides in that a packaging method of an electronic component for packaging the electronic component to a packaging substrate comprises the steps of a) forming a plurality of bumps having a predetermined quantity at connection portions of the electronic component; b) forming pads on the packaging substrate in such a manner as to correspond to the bumps, respectively; c) applying a solder paste to each of the pads formed on the surface of the packaging substrate so as to attain a specific quantity of solder components with the predetermined quantity of the solder bump; and d) heating the electronic component and the packaging substrate so that spherical or button-shaped connection bumps having a predetermined height are formed between the pads and the electronic component to connect the electronic component and the packaging substrate and to keep a predetermined gap between the electronic component and the packaging substrate, and cylindrical-post connection bumps are formed between the through-holes and the electronic component in accordance with this predetermined gap to connect the electronic component and the packaging substrate.

The specific quantity of the solder components at the step c) is determined by at least the predetermined quantity of each solder paste.

The specific quantity of the solder components is determined in accordance with the surface area of the pad.

The sixth aspect of the present invention resides in that a packaging method of an electronic component for packaging the electronic component to a packaging substrate comprises the steps of a) forming a plurality of solder bumps having a predetermined quantity at connection portions of the electronic component; b) forming pads on the packaging substrate in such a manner as to correspond to the bumps, respectively; c) applying a solder paste to each of the pads formed on the surface of the packaging substrate so as to attain a specific quantity of solder components with the predetermined quantity of the solder bump; d) inserting inclusion means having a predetermined thickness at a part of the space between the electronic component and the packaging substrate so as to keep a predetermined gap between the electronic component and the packaging substrate; and e) heating the electronic component and the packaging substrate to a predetermined temperature so that spherical or button-shaped connection bumps having a predetermined height are formed between the pads and the packaging substrate to connect the electronic component and the electronic component, and cylindrical-post connection bumps are formed between the through-holes and the electronic component in accordance with this predetermined gap to connect the electronic component and the packaging substrate.

The specific quantity of the solder components at the step c) is determined by at least the predetermined quantity of the respective solder paste. The specific quantity of the solder components is determined in accordance with the surface area of the pad.

The packaging methods described above can form the cylindrical-post connection bumps in association with the button-shaped or spherical connection bumps at the connection portions, and can improve reliability of solder connection of the BGA electronic component.

DESCRIPTION OF THE PREFERRED EMBODIMENTS

Hereinafter, preferred embodiments of the present invention will be explained with reference to the accompanying drawings.

FIGS. 1A to 1D are schematic sectional views showing step-wise a packaging method of electronic components according to one embodiment of the present invention.

Figure 1A:
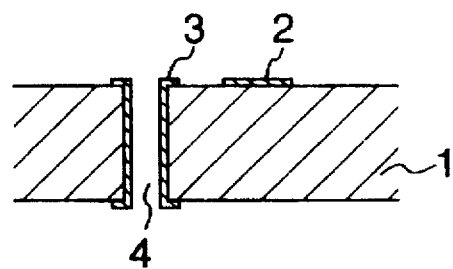
FIGS. 1A to 1D are sectional views showing step-wise a packaging method according to one embodiment of the present invention.

Referring initially to FIG. 1A, a connection pad 2 and a connection pad 3, which is provided with a through-hole 4, corresponding to each ball bump 7 of a BGA type electronic component 6, are formed on a printed board 1. Such a printed board 1 can be formed by, for example, a so-called "subtractive method" which comprises forming through-holes 4 by making predetermined positions of a substrate covered with a copper foil on both surfaces thereof, applying copper plating to the substrate as a whole by a method such as an electrolysis plating method so as to form copper plating layers inside, and on both surfaces of, the through-holes 4, and then removing selectively the copper plating layers on both surfaces by etching in such a manner as to leave the connection pads 2 and the connection pads 3 together with the through-hole.

Figure 1B:
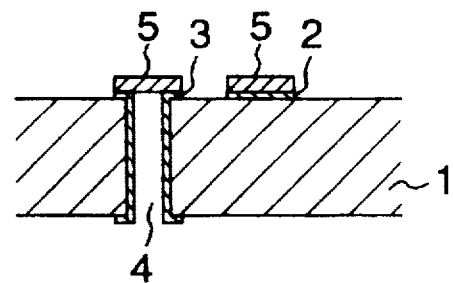

Next, referring to FIG. 1B, a solder paste 5 is supplied to the connection pad 2 and the connection pad 3 together with the through-hole. This solder paste 5 is prepared by mixing solder particles having a grain size of dozens of microns with a flux, for example.

Figure 1C:
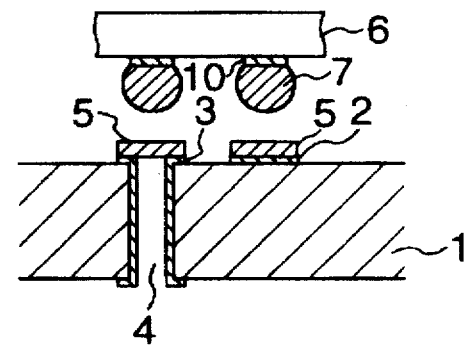
Figure 1D:
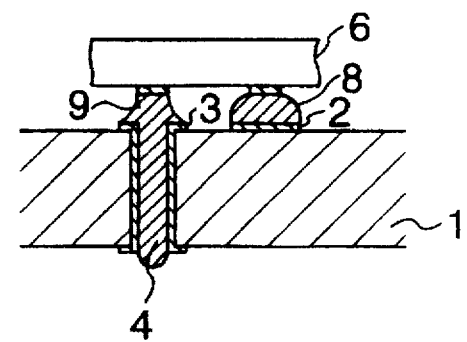

Further, as typically shown in FIG. 1C, an electronic component 6 including a plurality of ball bumps 7 made of a solder and disposed on connection pads 10 is positioned in such a manner that these ball bumps 7 oppose a plurality of connection pads 2 and connection pads 3 together with the through-hole (and solder paste 5), and is then mounted onto the printed board 1.

The ball bump 7 of the electronic component 6 can be formed by a so-called "ball transfer method", for example, which bonds the solder ball to the connection pad 10 through the flux and then applies a reflow operation.

Next, the reflow operation is carried out by placing the printed board having the electronic component 6 mounted thereto into a heating furnace heated to a predetermined temperature in accordance with the compositions of the ball bump 7 and the solder paste 5, and heating and melting the ball bump 7 as well as the solder paste 5. In this way, the electronic component 6 is soldered to the printed board 1 as typically shown in FIG. 1D.

In this embodiment, the molten solder formed as a result of melting of the ball bump 7 and the solder paste 5 of the connection pad 3 together with the through-hole flows out to the through-hole 4 and forms a cylindrical-post connection bump 9 having less stress concentration. A button-shaped connection bump 8 having a button-shaped sectional shape is formed between the ordinary connection pad 2 and the connection pad 10, and the size of the gap (stand-off) between the electronic component 6 and the printed board 1 is determined by this button-shaped connection bump 8. In other words, the height of the button-shaped connection bump 8 when it is molten and becomes round due to the surface tension determines the gap between the electronic component 6 and the printed board 1.

The cylindrical-post connection bump 9 is formed as described above, and its formation is determined at least by the total solder quantity of the ball bump 7, the solder paste 5 and the button-shaped connection bump 8 and by the gap between the electronic component 6 and the printed board 1. A sheet material or inclusion means having a predetermined thickness may be inserted in advance between the electronic component 6 and the printed board 1 so as to secure the gap between them.

As described above, the total solder quantity is determined by the ball bump 7, the solder paste 5 and the button-shaped connection bump 8 and their solder quantities are in turn determined also by the connection pad 10 of the electronic component 6, the connection pad 2 on the printed board 1, the surface area of the paste 5, the thickness of the printed board 1 (the depth of the through-hole 4) and the inner diameter of the through-hole 4.

The height of the button-shaped connection bump 8 is the gap between the electronic component 6 as a completed product mounted on the printed board 1 and the printed board 1, and is substantially equal to the thickness of the sheet material inserted when the electronic component 6 is mounted to the printed board 1 as described above. The connection bump 8 has the button-shape in the same way as in the conventional devices. The cylindrical-post connection bump 9 is thus formed at the connection portion of electronic component 6 where the stress is substantially large caused by the thermal expansion of the portion due to heat in operation of the electronic component 6, eliminating concentration of the stress. On the other hand, the button-shaped connection bump 8 is formed at the connection portion of the electronic component 6 having small stress caused by the thermal expansion, so as to determine the gap between the electronic component 6 as the completed product mounted on the printed board 1 and the printed board 1. The number of the cylindrical-post connection bumps 9 formed between the electronic component 6 and the printed board 1 and the number of the button-shaped connection bumps 8 are determined in advance, and when the number of the connection bumps 8 is so small that the gap for forming the connection bumps 9 cannot be secured, the sheet material is inserted between the electronic component 6 and the printed board 1 so as to secure this gap.

Next, an actual example where the cylindrical-post connection bumps 9 and the connection bumps 8 are formed when the electronic component 6 is mounted to the printed board 1 will be explained.

It will be assumed, for example, that the thickness of the printed board 1 packaged is 1.5 mm, the total solder quantity of the button-shaped connection bumps 8 by the ball bumps 7 and the solder paste 5 is 0.25 mm$^3$ (with the proviso that the solder paste 5 may be replaced by the flux so long as the total solder quantity of 0.25 mm$^3$ can be secured for the button-shaped connection bumps 8 by the ball bump 7), the diameter of the connection pad 2 on the side of the printed board 1 is 0.9 mm, the diameter of the connection pad 10 on the side of the electronic component 6 is 0.9 mm and the height of the button-shaped connection bump 8 is 0.4 mm. If the connection pad 3 together with the through-hole whose inner diameter is 0.2 mm is so disposed in this case as to correspond to the ball bump 7 on the printed board 1, the solder in the quantity of 0.05 mm$^3$ flows out to the through-hole 4 at the time of connection by reflow, and the cylindrical-post connection bump 9 having a minimum diameter portion of 0.6 mm can be formed.

Therefore, the packaging method of the electronic component according to this embodiment can form the cylindrical-post connection bumps 9 having lower stress concentration than the button-shaped connection bumps 8, and the BGA type electronic component 6 can be packaged to the printed board 1 with high solder connection reliability.

As described in Kyushu Matsushita Create Show Seminar Technical Report, June, 1993 and in IBM Journal R&D, 1993, 9, Vol. 37, No. 5, for example, thermal strain analysis reveals that when the spherical solder connection portion is changed to the drum-shaped connection portion having the same shape by the same solder quantity, the stress can be mitigated by about 10% in comparison with the spherical solder connection portion, and effectiveness of the cylindrical-post connection bump 9 of this embodiment is obvious.

Even in the case where the BGA type electronic component 6, which has a great number of ball bumps 7, has a so-called "multiple pin specification", has a different coefficient of expansion from that of the printed board 1 and has large exothermy, packaging can be conducted with high connection reliability.

Particularly when a BGA type electronic component 6 is packaged to the printed board 1 having high wiring efficiency, packaging having high efficiency can be attained by locally disposing the cylindrical-post connection bumps 9 on the connection bumps on which the stress concentrates (for example, several bumps at the corners of the rectangular disposition region of a plurality of ball bumps in the electronic component 6) in consideration of the stress of each connection bump, without impeding extension of the wiring pattern inside the printed board 1 by the formation of the through-holes 4.

When exchange of the BGA type electronic component 6 becomes necessary, too, this embodiment can easily heat the bump connection portion through the through-hole 4 and can melt the solder, so that the BGA type electronic component 6 can be easily exchanged.

FIGS. 2A to 2D are schematic sectional views showing step-wise the packaging method of the electronic component according to another embodiment of the present invention.

Figure 2A:
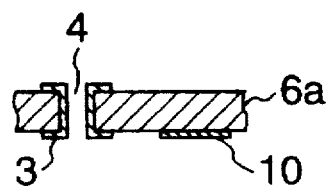
FIGS. 2A to 2D are sectional views showing step-wise a packaging method according to another embodiment of the present invention.

Referring to FIG. 2A, the connection pad 10 and the connection pad 3 together with the through-hole 4 are formed on a substrate 6a of a BGA type (which is also referred to as "LGA (Land Grid Array)" electronic component on which the ball bumps are not formed, in the same way as the production method of the printed board 1 in the embodiment described above.

Figure 2B:
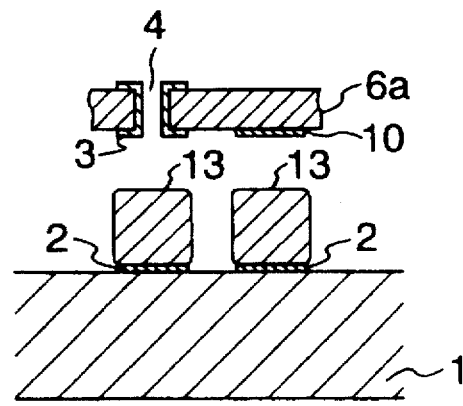
Figure 2C:
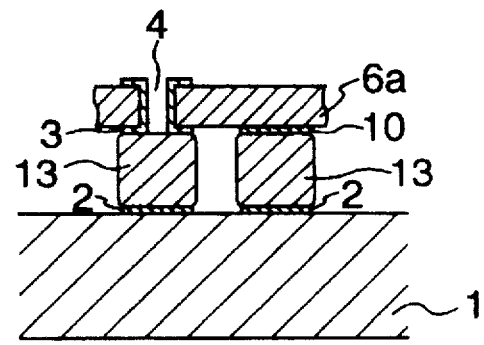

In FIG. 2B, the solder paste 13 is applied to a plurality of connection pads 2 of the printed board 1, and a plurality of connection pads 10 and a plurality of connection pads 3 together with the through-hole of the substrate 6a of the BGA type electronic component are so positioned as to oppose these connection pads 2. In FIG. 2C, the substrate 6a of the electronic component is superposed with, and mounted to, the printed board 1.

Incidentally, packaging of the substrate 6a of the electronic component may be effected by forming the ball bumps on the printed board 1 as shown in FIGS. 1A to 1D without using the solder paste 13.

Figure 2D:
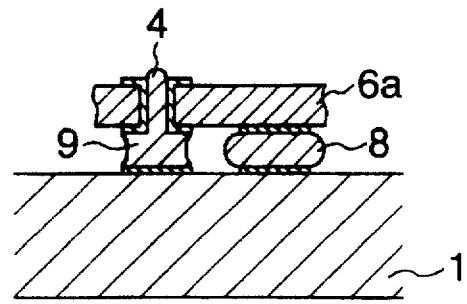

In FIG. 2D, soldering is effected by melting the solder paste 13 through the reflow operation at a predetermined temperature in accordance with the composition of the solder paste 13, etc.

At this time, the molten solder of the connection pad 3 together with the through-hole in this embodiment flows out to the through-hole 4, and the cylindrical-post connection bump 9 having less stress concentration can be formed. At the same time, the button-shaped connection bump 8 is formed between the ordinary connection pad 10 and connection pad 2, and the gap between the substrate 6a of the electronic component and the printed board 1 is determined by this button-shaped connection bump 8. In other words, the height of the button-shaped connection bump 8 when it is molten and becomes round due to the surface tension determines the gap size. This gap size is also a condition for forming the cylindrical-post connection bump 9.

Though the cylindrical-post connection bump 9 is formed as described above, the formation of this cylindrical-post connection bump 9 is determined by at least the total solder quantity of the solder paste 13 and by the gap between the substrate 6a of the electronic component and the printed board 1. A sheet material having a predetermined thickness may be inserted between the substrate 6a and the printed board 1 so as to secure the gap between them. The number of the cylindrical-post connection bumps 9 formed between the substrate 6a and the printed board 1 and the number of the button-shaped connection bumps 8 are determined in advance, but when the number of the connection bumps 8 is so small that the gap for forming the connection bumps 9 cannot be maintained, a sheet material may be inserted between the substrate 6a and the printed board 1 to secure the gap.

The total solder quantity described above depends on the connection pads 10 of the substrate 6a, the surface area of the connection pads 2 on the printed board 1, the thickness of the printed board 1 (the depth of the through-hole 4) and the inner diameter of the through-hole 4.

The height of the button-shaped connection bump 8 corresponds to the gap between the substrate 6a of the completed product mounted to the printed board 1 and the printed board 1 and is substantially equal to the thickness of the sheet material which is inserted when mounting the substrate 6a to the printed board 1 as described above. The connection bumps 8 are of the barrel-shaped type in the same way as in the conventional devices. In this way, the cylindrical-shaped connection bumps 9 are formed at the portion of the substrate 6a where the stress is substantially large due to heat in operation, eliminating the stress concentration. On the other hand, the button-shaped connection bumps 8 are formed at the connection portions of the substrate 6a where the stress is substantially small caused by the thermal expansion, so as to determine the gap between the substrate 6a of the completed product formed by mounting the substrate 6a to the printed board 1 and the printed board 1.

Next, an actual example where the cylindrical-post connection bumps 9 and the button-shaped connection bumps 8 are formed when the substrate 6a of the electronic component is mounted to the printed board 1 will be explained.

It will be explained, for example, that the thickness of the substrate 6a of the BGA type electronic component to be packaged is 1.5 mm, the total solder quantity of the button-shaped connection bumps 8 by the solder past 13 is 0.25 mm$^3$, the diameter of the connection pads 2 on the side of the printed board 1 is 0.9 mm, the diameter of the connection pads 10 on the side of the substrate 6a of the electronic component is 0.9 mm and the height of the button-shaped connection bumps 8 is 0.4 mm. In this case, when the connection pads 3 together with the through-hole 4 having an inner diameter of 0.2 mm are disposed, 0.05 mm$^3$ of the solder flows out to the through-hole 4 at the time of connection by fellow, and the cylindrical-post connection bumps 9 having a minimum diameter portion of 0.6 mm can be formed.

In this embodiment, too, the cylindrical-post connection bumps 9 having less stress concentration can be formed at the connection portions between the substrate 6a and the printed board 1. Therefore, reliability of the package structure of the substrate 6a of the electronic component to the printed board 1 through the cylindrical-post connection bumps 9 and the button-shaped connection bumps 8 can be improved.

Figure 3A:
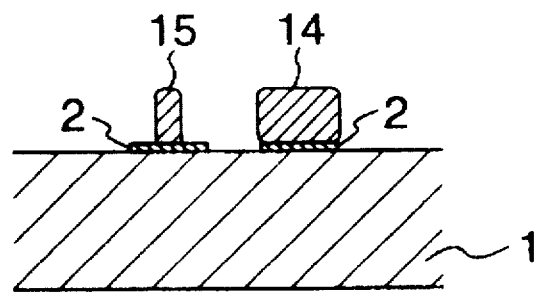
FIGS. 3A to 3C are sectional views showing step-wise a packaging method according to still another embodiment of the present invention.
Figure 3B:
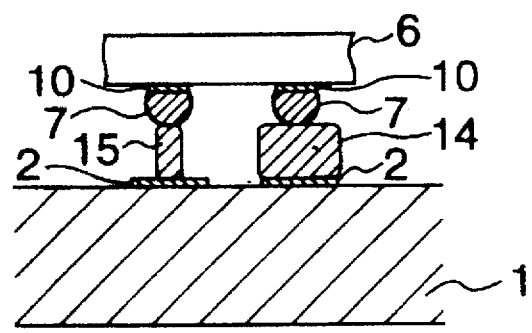
Figure 3C:
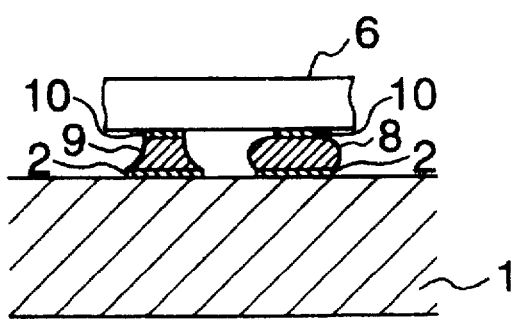

FIGS. 3A to 3C are schematic sectional views showing step-wise the packaging method of the electronic component according to still another embodiment of the present invention.

Referring to FIG. 3A, the connection pads 2 are formed on the printed board 1 by the production method such as the substractive method already described. Next, the solder paste 14 whose solder quantity is adjusted so as to form the button-shaped connection bumps 8 and the solder paste 15 whose solder quantity is adjusted so as to form the cylindrical-post connection bumps 9 are applied to the connection pads 2.

Next, in FIG. 3B, the BGA type electronic component 6, for example, is positioned so that a plurality of ball bumps 7 thereof correspond to the solder paste 14 and the solder paste 15, respectively, and is then superposed with, and mounted to, the printed board 1.

In FIG. 3C, the reflow operation is effected at temperatures in accordance with the compositions of the solder pastes 14 and 15, etc, so as to melt these solder pastes and to conduct soldering. In this way, the button-shaped connection bumps 8 having the barrel-shaped section and the cylindrical-post connection bumps 9 having less stress concentration are formed. In other words, the height of the button-shaped connection bump 8 when it is molten and becomes round due to the surface tension determines the gap size between the electronic component 6 and the printed board 1. This gap size is also a condition for forming the cylindrical-post connection bumps 9.

Though the cylindrical-post connection bumps 9 are formed as described above, the formation of the cylindrical-post connection bumps 9 is determined by at least the total solder quantity of the solder pastes 14 and 15 and by the gap between the electronic component 6 and the printed board 1. A sheet material having a predetermined thickness may be inserted between the electronic component 6 and the printed board 1 to secure the gap between them.

The number of the drum-shaped connection pads 9 formed between the electronic component 6 and the printed board 1 and the number of the button-shaped connection bumps 8 are predetermined but when the number of the connection bumps 8 is so small that the gap for forming the connection bumps 9 cannot be kept, a sheet material may be inserted between the electronic component 6 and the printed board 1 so as to secure the gap.

The total solder quantity is determined by the quantities of the ball bump 7 and the solder pastes 14, 15, and these solder quantities depend on the diameter of the connection pads 10 of the electronic component 6 and on the diameter of the connection pads 2 on the printed board 1.

The height of the button-shaped connection bump 8 is the gap between the electronic component 6 as the completed product obtained by mounting the electronic component 6 on the printed board 1 and the printed board 1, and is substantially equal to the thickness of the sheet material inserted when the electronic component 6 is mounted to the printed board 1 as described above. The connection bumps 8 are of the barrel-shaped type in the same way as in the conventional devices. In this way, the cylindrical-post connection bumps 9 are formed at the connection portions of the electronic component 6 at which exothermy is particularly high, so as to eliminate the stress concentration due to exothermy. On the other hand, the button-shaped connection bumps 8 are formed at the connection portions of the electronic components at which exothermy is small, and determines the gap between the electronic component 6 of the completed product obtained by mounting the electronic component to the printed board 1 and the printed board 1.

Next, an actual example where the cylindrical-post connection bumps 9 and the button-shaped connection bumps 8 are formed when the electronic component 6 is mounted to the printed board 1 will be explained.

It will be assumed, for example, that the total solder quantity of the ball bumps 7 and the button-shaped connection bumps 8 by the solder paste 14 is 0.25 mm$^3$, the total solder quantity of the ball bumps 7 and the cylindrical-post connection bumps 9 by the solder paste 15 is 0.20 mm$^3$, the diameter of the connection pads 2 on the side of the printed board 1 is 0.9 mm, the diameter of the connection pads 10 on the side of the BGA type electronic component 6 is 0.9 mm and the height of the button-shaped connection bumps 8 is 0.4 mm. In this instance, the cylindrical-post connection bumps 9 having a minimum diameter portion of 0.6 mm can be formed by effecting soldering by reflow.

In this case, too, the cylindrical-post connection bumps 9 having less stress concentration at the connection portions between the electronic component 6 and the printed board 1 can be formed, so that reliability of the packaging structure of the electronic component 6 to the printed board 1 through the cylindrical-post connection bumps 9 and the button-shaped connection bumps 8 can be improved. Further, because the formation work of the through-holes is not necessary, the production process of the printed board 1 can be simplified.

The actual examples have been explained in the foregoing three examples but when the thickness of the printed board 1, the inner diameter of the through-hole 4 and the sizes of the connection pads 2, 10 and the size of the connection pad 3 together with the through-hole are different from those of the foregoing embodiments, the total solder quantity and the gap between the electronic component 6 and the printed board 1 are set afresh so as to form the cylindrical-post connection bumps 9.

Similarly, when the thickness of the substrate 6a, the inner diameter of the through-hole 4, the size of the connection pads 3 together with the through-hole and the sizes of the connection pads 2, 10 are different from those in the embodiment shown in FIGS. 2A to 2D, the total solder quantity and the gap between the substrate 6a and the printed board 1 are set afresh to form the cylindrical-post connection bumps 9.

Further, in FIGS. 3A to 3C, too, when the sizes of the connection pads 2, 10 are different from those of the embodiments explained already, the total solder quantity and the gap between the electronic component 6 and the printed board 1 are set afresh to form the cylindrical-post connection bumps 9.

Incidentally, the gap between the electronic component 6 and the printed board 1 and the gap between the substrate 6a and the printed board 1 are determined also by the proportion of the number of the cylindrical-post connection bumps 9 and the number of the button-shaped connection bumps 8.

What is claimed is:

1. A packaging method of an electronic component for packaging said electronic component to a packaging substrate through solder bumps disposed on said electronic component, wherein through-holes are formed in pads of said packaging substrate corresponding to said solder bumps, and wherein a part of said solder bump molten at the time of reflow is caused to flow into said through-hole and the shape of said solder bump is formed into a cylindrical-post shape.

2. A packaging method of an electronic component for packaging said electronic component to a packaging substrate through solder bumps disposed on said electronic component or a solder supplied, wherein through-holes are formed in pads of said electronic component, wherein a part of said solder bump or said solder supplied which is molten is caused to flow into said through-hole at the time of reflow of said solder bump formed on said packaging substrate or said solder supplied, and wherein the shape of said solder bump connecting said electronic component and said printed board is formed into a cylindrical-post shape.

3. A packaging method of an electronic component for packaging said electronic component to a packaging substrate through solder bumps disposed on said electronic component, wherein a gap size between said electronic component and said packaging substrate and a solder supply quantity to said packaging substrate are controlled, and wherein the shape of solder bumps for connecting said electronic component and said packaging substrate, formed by reflow, is formed into a cylindrical-post shape.

4. A packaging method of an electronic component for packaging said electronic component to a packaging substrate, comprising the steps of:

a) forming solder bumps at connection portions of said electronic component;

b) forming through-holes and pads on said packaging substrate in such a manner as to correspond to said solder bumps;

c) applying a solder paste to pad portions of said through-holes and said pads formed on the surface of said packaging substrate in such a manner that a specific quantity of solder components are obtained in combination with said solder bumps; and d) heating said electronic component and said packaging substrate to a predetermined temperature such that button-shaped connection bumps having a predetermined height are formed between said pads and said electronic component to connect said electronic component and said packaging substrate and to keep a predetermined gap therebetween, and cylindrical-post connection bumps are formed between said through-holes and said electronic component in accordance with said predetermined gap to connect said electronic component and said packaging substrate.

5. A packaging method of an electronic component according to claim 4, wherein said specific quantity of said solder component at said step c) is determined by at least said solder bump and said solder paste.

6. A packaging method of an electronic component according to claim 5, wherein said specific quantity of said solder components is determined in accordance with the surface area of said pads, the surface area of said pad portions of said through-hole, the depth of said through-holes, and the inner diameter of said through-holes.

7. A packaging method of an electronic component for packaging said electronic component to a packaging substrate, comprising the steps of:

a) forming solder bumps at connection portions of said electronic component;

b) forming through-holes and pads on said packaging substrate in such a manner as to correspond to said solder bumps;

c) applying a solder paste to pad portions of said through-holes and said pads formed on the surface of said packaging substrate in such a manner that a specific quantity of solder components are obtained in combination with said solder bumps;

d) inserting inclusion means having a predetermined thickness at a part of the space between said electronic component and said packaging substrate so as to form a predetermined gap therebetween; and e) heating said electronic component and said packaging substrate to a predetermined temperature such that button-shaped connection bumps having a predetermined height are formed between said pads and said electronic component so as to connect said electronic component and said packaging substrate and cylindrical-post connection bumps are formed between said through-holes and said electronic component in accordance with said predetermined gap so as to connect said electronic component and said packaging substrate.

8. A packaging method of an electronic component according to claim 7, wherein said specific quantity of said solder components at said step c) is determined by at least said solder bumps and said solder paste.

9. A packaging method of an electronic component for packaging said electronic component to a packaging substrate, comprising the steps of:

a) forming through-holes and pads on a substrate for mounting said electronic component thereto;

b) forming pads on said packaging substrate in such a manner as to correspond to said through-holes and said pads formed on said substrate of said electronic component;

c) applying a solder paste to each of said pads on said packaging substrate so as to attain a specific quantity of solder components in accordance with each of said pads on said packaging substrate; and d) heating said substrate for mounting said electronic component and said packaging substrate to a predetermined temperature such that button-shaped connection bumps having a predetermined height are formed between said pads of said substrate for mounting said electronic component and said packaging substrate so as to connect said substrate for mounting said electronic component and said packaging substrate and to keep a predetermined gap between them, and cylindrical-post connection bumps are formed between said through-holes of said substrate for mounting said electronic component and said pads of said packaging substrate in accordance with said predetermined gap so as to connect said substrate for mounting said electronic component and said packaging substrate.

10. A packaging method of an electronic component according to claim 9, wherein said specific quantity of said solder components is determined in accordance with the surface area of said pads, the surface area of said pad portions of said through-holes, the depth of said through-holes, and the inner diameter of said through-holes.

11. A packaging method of an electronic component for packaging said electronic component to a packaging substrate, comprising the steps of:

a) forming through-holes and pads on a substrate for mounting said electronic component thereto;

b) forming pads on said packaging substrate in such a manner as to correspond to said through-holes and said pads formed on said substrate of said electronic component;

c) applying a solder paste to each of said pads on said packaging substrate so as to attain a specific quantity of solder component in accordance with each of said pads on said packaging substrate;

d) inserting inclusion means having a predetermined thickness at a part of the space between said substrate for mounting said electronic component and said packaging substrate so as to form a predetermined gap therebetween; and e) heating said substrate for mounting said electronic component and said packaging substrate to a predetermined temperature such that button-shaped connection bumps having a predetermined height are formed between said pads of said substrate for mounting said electronic component and said packaging substrate so as to connect said substrate for mounting said electronic component and said packaging substrate, and cylindrical-post connection bumps are formed between said through-holes of said substrate for mounting said electronic component and said pads of said packaging substrate in accordance with said predetermined gap so as to connect said substrate for mounting said electronic component and said packaging substrate.

12. A packaging method of an electronic component according to claim 11, wherein said specific quantity of said solder components is determined in accordance with the surface area of said pads, the surface area of said pad portions of said through-holes, the depth of said through-hole, and the inner diameter of said through-holes.

13. A packaging method of an electronic component for packaging said electronic component to a packaging substrate, comprising the steps of:

a) forming a plurality of solder bumps at connection portions of said electronic component;

b) forming pads on said packaging substrate in such a manner as to correspond to said solder bumps, respectively;

c) applying a solder paste to each of said pads formed on the surface of said packaging substrate so as to attain a specific quantity of solder components in combination with said solder bumps; and d) heating said electronic component and said packaging substrate to a predetermined temperature such that button-shaped connection bumps having a predetermined height are formed between certain of said pads and said electronic component so as to connect said electronic component and said packaging substrate and to keep a predetermined gap between them, and cylindrical-post connection bumps are formed between other of said pads and said electronic component in accordance with said predetermined gap so as to connect said electronic component and said packaging substrate.

14. A packaging method of an electronic component according to claim 13, wherein said specific quantity of said solder components at said step c) is determined by at least said solder paste.

15. A packaging method of an electronic component according to claim 14, wherein said specific quantity of said solder components is determined in accordance with the surface area of said pads.

16. A packaging method of an electronic component for packaging said electronic component to a packaging substrate, comprising the steps of:

a) forming a plurality of solder bumps at connection portions of said electronic component;

b) forming pads on said packaging substrate in such a manner as to correspond to said solder bumps, respectively;

c) applying a solder paste to each of said pads formed on the surface of said packaging substrate so as to attain a specific quantity of solder components in combination with said solder bumps;

d) inserting inclusion means having a predetermined thickness at a part of the space between said electronic component and said packaging substrate so as to keep a predetermined gap between said electronic component and said packaging substrate; and e) heating said electronic component and said packaging substrate to a predetermined temperature so that button-shaped connection bumps having a predetermined height are formed between certain of said pads and said electronic component so as to connect said electronic component and said packaging substrate, and cylindrical-post connection bumps are formed between other of said pads and said electronic component in accordance with said predetermined gaps so as to connect said electronic component and said packaging substrate.

17. A packaging method of an electronic component according to claim 16, wherein said specific quantity of said solder components at said step c) is determined by at least said solder pastes.

18. A packaging method of an electronic component according to claim 17, wherein said specific quantity of said solder components is determined in accordance with the surface area of said pads.

* * * * *